(12) United States Patent
Noguchi et al.

(10) Patent No.: US 8,861,648 B2
(45) Date of Patent: Oct. 14, 2014

(54) RECEIVING DEVICE AND DEMODULATION DEVICE

(75) Inventors: Hidemi Noguchi, Tokyo (JP); Junichi Abe, Tokyo (JP); Tomoyuki Yamase, Tokyo (JP); Yasushi Amamiya, Tokyo (JP)

(73) Assignee: NEC Corporation, Tokyo (JP)

( * ) Notice: Subject to any disclaimer, the term of this patent is extended or adjusted under 35 U.S.C. 154(b) by 492 days.

(21) Appl. No.: 13/260,297

(22) PCT Filed: Mar. 31, 2010

(86) PCT No.: PCT/JP2010/055814
§ 371 (c)(1),
(2), (4) Date: Sep. 24, 2011

(87) PCT Pub. No.: WO2010/131528
PCT Pub. Date: Nov. 18, 2010

(65) Prior Publication Data
US 2012/0020677 A1 Jan. 26, 2012

(30) Foreign Application Priority Data

May 11, 2009 (JP) ................. 2009-114503

(51) Int. Cl.
*H04B 17/00* (2006.01)
*H04B 3/46* (2006.01)
*H03L 7/081* (2006.01)
*H04L 7/033* (2006.01)
*H04L 7/00* (2006.01)

(52) U.S. Cl.
CPC .............. *H04L 7/033* (2013.01); *H03L 7/0816* (2013.01); *H04L 7/0029* (2013.01)
USPC ........... 375/327; 375/299; 375/267; 375/341; 375/262

(58) Field of Classification Search
CPC ...... H04L 7/0029; H04L 7/033; H03L 7/0816
USPC ......... 375/327, 343, 373, 376, 377, 371, 350, 375/322
See application file for complete search history.

(56) References Cited

U.S. PATENT DOCUMENTS

2002/0150153 A1* 10/2002 Frenkel et al. ................ 375/222
2003/0095611 A1 5/2003 Budde et al.
(Continued)

FOREIGN PATENT DOCUMENTS

| JP | 2-137550 A | 5/1990 |
|---|---|---|
| JP | 7-32464 B | 4/1995 |
| JP | 9-224063 A | 8/1997 |
| JP | 2003-198510 A | 7/2003 |

(Continued)

OTHER PUBLICATIONS

Mueller and Muller, "Timing recovery in digital synchronous data receivers," (IEEE Trans. Comm., vol. COM-24, No. 5, pp. 516-531, May 1976).

*Primary Examiner* — Qutbuddin Ghulamali
(74) *Attorney, Agent, or Firm* — McGinn IP Law Group, PLLC (57) ABSTRACT

To adequately perform sampling, a receiving device that solves problems that involve an increase in circuit area and an increase in cost, is provided.

A/D converter 2 samples a coherent signal that is an analog signal in synchronization with a sampling clock signal so as to convert the analog signal into a digital signal. DSP 3 demodulates the digital signal converted by A/D converter 2 and computes a phase of the sampling clock signal in which an error rate of the digital signal is the minimum based on the demodulated digital signal. Sampling clock extraction circuit 4 extracts a clock signal having a symbol rate of the coherent signal therefrom. Phase adjustment circuit 5 adjusts the phase of the clock signal extracted by sampling clock extraction circuit 4 to the phase computed by DSP 3 and generates a clock signal having the adjusted phase as the sampling clock signal.

3 Claims, 5 Drawing Sheets

(56) References Cited

U.S. PATENT DOCUMENTS

| | | |
|---|---|---|
| 2003/0118139 A1* | 6/2003 | Yamada ..................... 375/371 |
| 2005/0063277 A1* | 3/2005 | Sugata ..................... 369/60.01 |
| 2008/0198051 A1 | 8/2008 | Tanimura et al. |
| 2008/0267638 A1 | 10/2008 | Nakashima et al. |
| 2008/0272943 A1 | 11/2008 | Tanimura et al. |
| 2009/0047030 A1 | 2/2009 | Hoshida |

FOREIGN PATENT DOCUMENTS

| | | |
|---|---|---|
| JP | 2003-209470 A | 7/2003 |
| JP | 2004-253945 A | 9/2004 |
| JP | 2005-78743 A | 3/2005 |
| JP | 2005-78789 A | 3/2005 |
| JP | 2008-205654 A | 9/2008 |
| JP | 2008-278249 A | 11/2008 |
| JP | 2009-49613 A | 3/2009 |

* cited by examiner

Fig.10

RECEIVING DEVICE AND DEMODULATION DEVICE

TECHNICAL FIELD

The present invention relates to a receiving device and a modulation method, in particular, to those that use an A/D converter based on a coherent receiving format for an optical communication system.

BACKGROUND ART

In recent years, as networks have operated at high speeds and with high capacities, the importance of coherent optical communication in optical transmission systems has increased. This means that coherent optical communication has excellent optical noise resistance, nonlinearity resistance, and excellent frequency use efficiency. In addition, as a receiving format for coherent optical communication, a digital coherent format that can correct dispersion distortion that occurs in the waveforms of optical signals and that uses a small number of optical parts is increasingly attractive.

In the digital coherent format, the receiver is provided with an A/D converter and a DSP (Digital Signal Processor). A received optical signal is sampled based on a sampling clock by the A/D converter so as to convert the received optical signal as an analog signal into a digital signal. Thereafter, the digital signal is processed by the DSP so at to demodulate the digital signal.

To secure the reliability of optical communication in the digital coherent format, it is important to perform A/D conversion such that information with respect to the intensity and phase of the received optical signal is not lost.

Generally, when the sampling rate of the A/D converter is caused to be sufficiently higher than the symbol rate of the received optical signal, the A/D conversion can be performed without loss of information of the received optical signal.

However, because of technical restrictions such as performance limits of various devices provided in the receiver, it is difficult to cause the sampling rate to be sufficiently higher than the symbol rate of the received optical signal. Even if the sampling rate were caused to be sufficiently high, since the load imposed on the DSP for the digital signal process increases, the area of the principal circuit section and the drive frequency of the DSP would rise, resulting in an increase of the circuit area of the DSP and a rise of the cost.

Because of technical restrictions and problems in which there is an increase in the size of the circuit area of the DSP and a cost increase, it is not realistic to make the sampling rate sufficiently higher than the symbol rate of the optical signal.

Thus, it is desired to lower the sampling rate without loss of information of the received optical signal. It is further desired to cause the sampling rate to be equal to the symbol rate of the received optical signal. The sampling performed at a sampling rate equal to the symbol rate of the received optical signal is referred to as baud rate sampling.

To perform A/D conversion without loss of information of the received optical signal based on the baud rate sampling, it is necessary to ensure that the received optical signal is phase-synchronized with the sampling clock. Unless it is made certain the received optical signal is phase-synchronized with the sampling click, since information of the received optical signal cannot be digitized with a high signal-to-noise ratio, the error rate of the received optical signal rises.

As a technique that secures that the received signal is phase-synchronized with the sampling clock, for example, a clock reproduction circuit as presented in Patent Literature 1 is known.

In the clock reproduction circuit presented in Patent Literature 1, an A/D converter samples an IF signal (corresponding to the received optical signal) based on a sampling clock so as to perform the A/D conversion for the IF signal. The IF signal that has been converted from an analog signal into a digital signal is demodulated by a digital signal process and is thereby converted into a base band signal. Thereafter, the clock reproduction circuit adjusts a timing signal of the IF signal based on the base band signal so as to phase-synchronize the IF signal with the sampling clock.

However, the clock reproduction circuit presented in Patent Literature 1 assumes that even if the timing signal of the IF signal varies after the IF signal has been phase-synchronized with the sampling clock, the IF signal will be phase-synchronized with the sampling clock. Thus, in the initial state where a signal is initially received, the base band signal is demodulated based on an inadequate sampling clock that has not been phase-synchronized with the sampling clock. Thus, in the initial state, even if the sampling clock is generated based on the base band signal, the IF signal will not be phase-synchronized with the sampling clock.

As a technique that allows the received optical signal to be phase-synchronized with the sampling clock even in the initial state, an optical receiving device presented in Patent Literature 2 is known.

Figure 1:
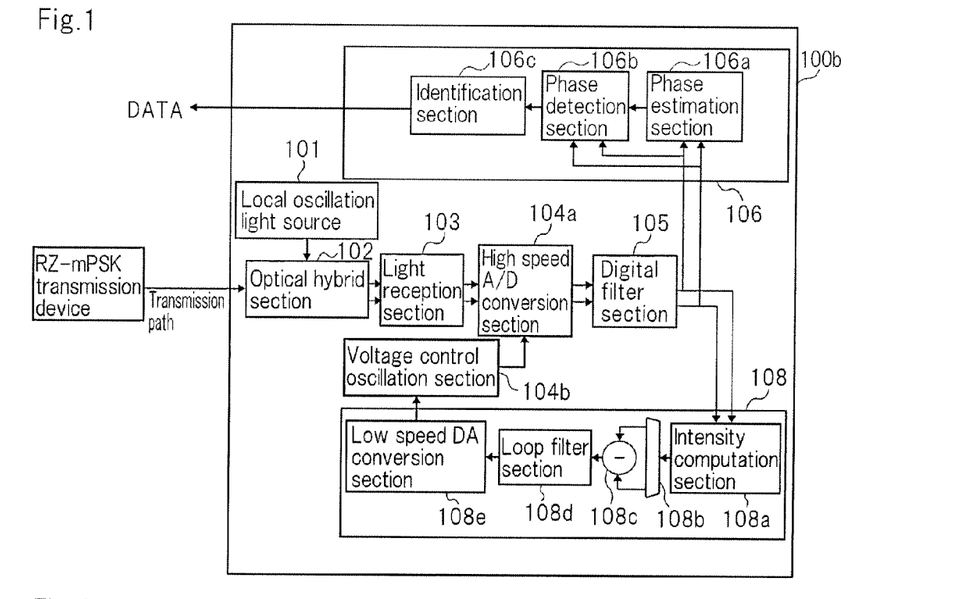
FIG. 1 is a block diagram showing a structure of an A/D conversion control device presented in Patent Literature 2.

FIG. 1 is a block diagram showing a structure of the optical receiving device presented in Patent Literature 2.

In the optical receiving device, high speed A/D conversion section 104a samples a received signal received by light reception section 103 in synchronization with a sampling clock so as to perform the A/D conversion for the received signal. Digital filter section 105 corrects the waveform in distortion of the received signal that has been converted into a digital signal so as to reproduce the received signal.

Control value computation section 108 extracts error information that represents an error between an optimum timing and the sampling timing from the signal that has been corrected with respect to the waveform distortion by digital filter section 105. Voltage control oscillation section 104b adjusts the phase of the sampling clock based on the error information so as to phase-synchronize the received signal with the sampling clock.

The above-described process of the optical receiving device assumes that the waveform distortion correction performed by digital filter section 105 is correct to some extent. Thus, in the initial state where the signal is initially received, since the tap coefficients of digital filter section 105 are inadequate values, the waveform distortion cannot be corrected and thereby error information that represents inadequate sampling timing is likely to be extracted.

Figure 2:
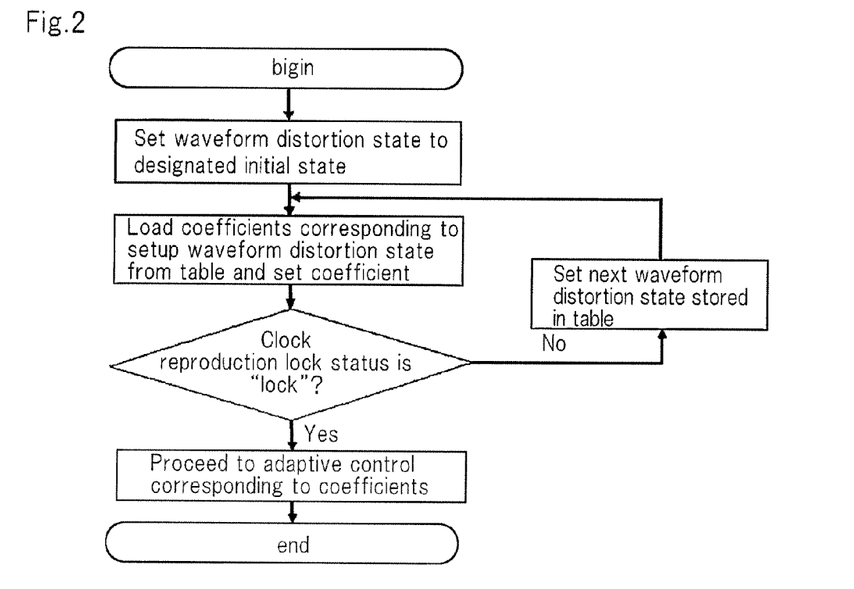
FIG. 2 is a flow chart describing an operation of the A/D conversion control device presented in Patent Literature 2.

Thus, the optical receiving device presented in Patent Literature 2 performs an operation according to the flow chart shown in FIG. 2 so as to phase-synchronize the received signal with the sampling clock even in the initial state.

Specifically, first, the optical receiving device sets the state of the waveform distortion to a predetermined initial state, loads tap coefficients corresponding to the state of the waveform distortion from a lookup table, and sets them to digital filter section 105.

Thereafter, the optical receiving device determines whether or not the lock status of the clock reproduction is "lock," namely the waveform distortion of the reproduced signal converges to a predetermined range within a predetermined period of time.

If the lock status is not "lock," the optical receiving device sets the state of the waveform distortion to the next state, loads tap coefficients corresponding to the resultant state from the lookup table, and sets the tap coefficients to digital filter section 105.

The optical receiving device repeats the above-described operation until the lock status becomes "lock" so as to phase-synchronize the received signal with the sampling clock.

As a result, the received signal can be phase-synchronized with the sampling clock even in the initial state.

Related Art Literature

Patent Literature

Patent Literature 1: JP9-224063A
Patent Literature 2: JP2008-205654A

SUMMARY OF THE INVENTION

Problem to be Solved by the Invention

Since it is difficult for the optical receiving device presented in Patent Literature 2 to predict the initial state of the wavelength distortion, the device needs to be provided with a lookup table that includes many different kinds of contents so that received signal can be phase-synchronized with the sampling clock in the initial state.

Thus, the lookup table becomes large and thereby requires a large capacity storage device. As a result, to phase-synchronize the received signal with the sampling clock in the initial state and thereby adequately sample the received signal, problems arise in which the circuit area and the cost of the optical receiving device increase.

If there are a lot of variations of states of waveform distortions, since a process that causes the lock status to be "locked" is repeated an increasing number of times, there also arises a problem in which the time necessary for causing the received signal to be phase-synchronized with the sampling clock becomes long.

An object of the present invention is to provide a receiving device and a demodulation method that can solve the above-described problems in which there is a tradeoffs between an increase of the circuit area and a rise in the cost, in the procedure for adequately.

Means that Solve the Problem

A receiving device according to the present invention includes reception means that receives an analog signal; extraction means that extracts a clock signal having a same frequency as that of a symbol rate of the analog signal from the analog signal received by said reception means; conversion means that samples the analog signal received by said reception means in synchronization with a sampling clock signal so as to convert the analog signal into a digital signal; control means that demodulates the digital signal converted by said conversion means and computes a phase of said sampling clock signal in which an error rate of the digital signal is the minimum based on the demodulated digital signal; and adjustment means that adjusts a phase of the clock signal extracted by said extraction means to the phase computed by said control means and generates the clock signal having the adjusted phase as said sampling clock signal.

A demodulation method according to the present invention includes receiving an analog signal; extracting a clock signal having a same frequency as that of a symbol rate of the analog signal from said received analog signal; sampling said received analog signal in synchronization with a sampling clock signal so as to convert the analog signal into a digital signal; demodulating said converted digital signal and computing a phase of said sampling clock signal in which an error rate of the digital signal is the minimum based on the demodulated digital signal; and adjusting a phase of said extracted clock signal to said computed phase and generating the clock signal having the adjusted phase as said sampling clock signal.

Effect of the Invention

According to the present invention, while the circuit area and cost are prevented from increasing, sampling can be adequately performed.

CARRY OUT THE INVENTION

In the following, with reference to drawings, exemplary embodiments of the present invention will be described.

First Exemplary Embodiment

Figure 3:
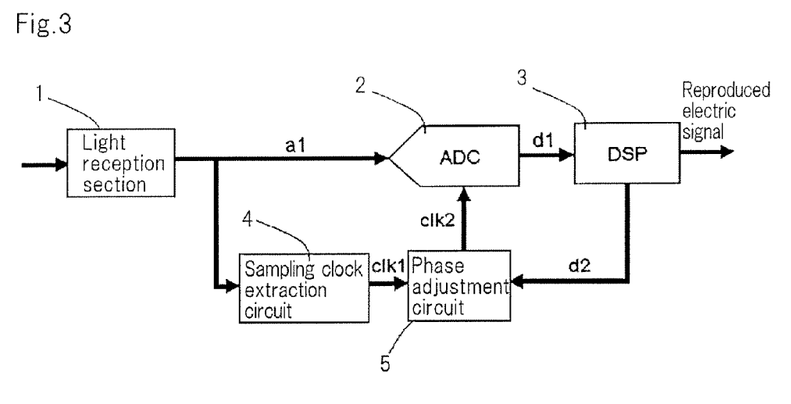
FIG. 3 is a block diagram showing a structure of a receiving device according to a first exemplary embodiment of the present invention.

FIG. 3 is a block diagram showing a structure of a receiving device according to a first exemplary embodiment of the present invention. In FIG. 1, the receiving device includes light reception section 1, A/D converter (ADC) 2, DSP (Digital Signal Processor) 3, sampling clock extraction circuit 4, and phase adjustment circuit 5.

Light reception section 1 exemplifies a reception means. Light reception section 1 receives an optical coherent signal and converts the received optical coherent signal into coherent signal a1 that is an electric signal. Light reception section 1 inputs coherent signal a1 to A/D converter 2 and sampling clock extraction circuit 4. The optical coherent signal and coherent signal a1 are analog signals.

A/D converter 2 exemplifies a conversion means. A/D converter 2 samples coherent signal a1 that is input from light reception section 1 in synchronization with sampling clock signal clk2 so as to convert coherent signal a1 into digital signal d1. A/D converter 2 inputs digital signal d1 to DSP 3.

This exemplary embodiment assumes that A/D converter 2 samples every symbol of coherent signal a1 one time. In other words, this exemplary embodiment assumes that the sampling rate of A/D converter 2 matches the symbol rate of coherent signal a1 (optical coherent signal).

DSP 3 exemplifies a control means. DSP 3 performs a digital signal process for digital signal d1 that is input from A/D converter 2 so as to demodulate digital signal d1. DSP 3 outputs demodulated digital signal d1 as reproduced electric signal.

In addition, DSP 3 computes the phase of sampling clock signal clk2 in which the error rate of digital signal d1 is the minimum based on demodulated digital signal d1.

Specifically, first, DSP 3 extracts the sampling timing of sampling clock signal clk2 for digital signal d1 based thereon. As an exemplary sampling timing extraction method, Mueller and Muller, "Timing recovery in digital synchronous data receivers," (IEEE Trans. Comm., Vol. COM-24, No. 5, pp. 516-531, May 1976) is known. It should be noted that another extraction method other than "Timing recovery in digital synchronous data receivers" may be applied.

Then, DSP 3 measures the error rate of the digital signal, generates control signal d2 that causes the phase of clock signal clk1 to be adjusted such that the sampling timing is shifted, and inputs control signal d2 to phase adjustment circuit 5. The error rate is for example BER (Bit Error Rate).

Then, DSP 3 repeats the above-described operation so as to gradually shift the sampling timing and computes the error rate based on every shifted sampling timing. DSP 3 searches for the minimum error rate from those that it has computed and then computes the sampling timing at the minimum error rate as the phase of sampling clock signal clk2 in which the error rate of digital signal d1 is the minimum.

Thereafter, DSP 3 generates control signal d2 that causes the phase of clock signal clk1 to be the computed phase and then inputs control signal d2 to phase adjustment circuit 5.

Sampling clock extraction circuit 4 extracts clock signal clk1 having the same frequency as that of the symbol rate of coherent signal a1 from coherent signal a1 that is input from light reception section 1 and inputs clock signal clk1 to phase adjustment circuit 5.

Phase adjustment circuit 5 exemplifies an adjustment means. Phase adjustment circuit 5 adjusts the phase of clock signal clk1 that is input from sampling clock extraction circuit 4 based on control signal d2 that is input from DSP 3 so as to adjust the phase of clock signal clk1 to the phase computed by DSP 3. Phase adjustment circuit 5 generates clock signal clk1 having the adjusted phase as sampling clock signal clk2.

Clock signal clk1 has the same frequency as that of the symbol rate of coherent signal a1. Although the phase of clock signal clk1 has been adjusted, the frequency of clock signal clk1 has not been multiplied or divided. Thus, the sampling rate of A/D converter 2 matches the symbol rate of coherent signal a1.

Phase adjustment circuit 5 inputs sampling clock signal clk2 to A/D converter 2.

As described above, according to this exemplary embodiment, A/D converter 2 samples coherent signal a1 that is an analog signal in synchronization with sampling clock signal clk2 so as to convert coherent signal a1 into digital signal d1. DSP 3 demodulates digital signal d1 converted by A/D converter 2 and computes the phase of sampling clock signal clk2 in which the error rate of digital signal d1 is the minimum based on the demodulated digital signal. Sampling clock extraction circuit 4 extracts clock signal clk1 having the symbol rate of coherent signal a1 from coherent signal a1. Phase adjustment circuit 5 adjusts the phase of clock signal clk1 extracted by sampling clock extraction circuit 4 to the phase computed by DSP 3 and generates clock signal clk1 having the adjusted phase as sampling clock signal clk2.

In this case, the phase of clock signal clk1 is adjusted to a phase in which the error rate of digital signal d1 is the minimum and thereby sampling clock signal clk2 is generated. Coherent signal a1 is sampled in synchronization with sampling clock signal clk2 and thereby converted into digital signal d1. When the error rate of digital signal d1 is the minimum, coherent signal a1 is considered to be phase-synchronized with sampling clock signal clk2.

Thus, even if the waveform distortion of the optical coherent signal is large, sampling can be adequately performed without requiring of a lookup table. Consequently, sampling can be adequately performed while preventing an increase in the size of circuit area and a rise in the cost. In addition, time for which coherent signal a1 is phase-synchronized with sampling clock signal clk2 can be suppressed from increasing.

Second Exemplary Embodiment

Figure 4:
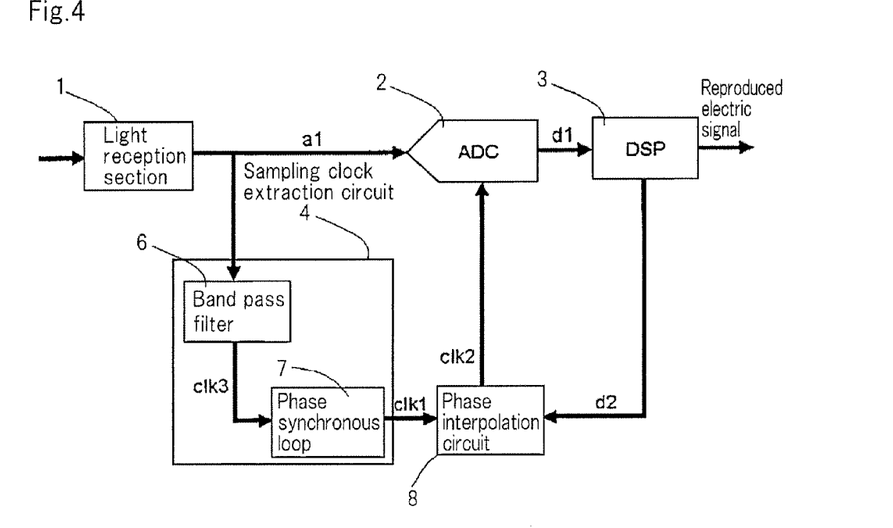
FIG. 4 is a block diagram showing a structure of a receiving device according to a second exemplary embodiment of the present invention.

FIG. 4 is a block diagram showing a structure of a receiving device according to a second exemplary embodiment of the present invention. In FIG. 4, similar functional sections to those shown in FIG. 3 are denoted by similar reference numerals and their description will be omitted.

In FIG. 4, sampling clock extraction circuit 4 includes band pass filter 6 and phase synchronous loop 7. In addition, phase interpolation circuit 8 is used as an example of phase adjustment circuit 5.

The structure of the other sections is the same as that shown in FIG. 3. Light reception section 1 inputs coherent signal a1 to A/D converter 2 and band pass filter 6 of sampling clock extraction circuit 4. DSP 3 inputs control signal d2 to phase interpolation circuit 8.

Band pass filter 6 causes only a signal that has a predetermined frequency of coherent signal a1 that is input from light reception section 1 to pass so as to extract the signal having the predetermined frequency from coherent signal a1 as basic clock signal clk3.

The predetermined frequency is the frequency of clock signal clk1, namely the same frequency as that of the symbol rate of coherent signal a1. Thus, frequency information that is not necessary to extract clock signal clk1 from coherent signal a1 can be removed.

Band pass filter 6 inputs basic clock signal clk3 to phase synchronous loop 7.

Phase synchronous loop 7 locks the phase of basic clock signal clk3 that is input from band pass filter 6 and generates basic clock signal clk3 having the locked phase as clock signal clk1. Thus, jitter of basic clock signal clk3 is decreased and thereby adequate clock signal clk1 is generated.

Phase synchronous loop 7 inputs clock signal clk1 to phase interpolation circuit 8.

The higher the Q value of band pass filter 6, the better the effect is. However, since clock signal clk1 is extracted by phase synchronous loop 7 that locks the phase of basic clock signal clk3, it is sufficient that the Q value of band pass filter 6 can lock the phase of basic clock signal clk3 to the degree that it is as high as phase synchronous loop 7. Thus, band pass filter 6 can be easily accomplished by an LC filter with a Q value of around 10 that can be implemented on an LSI (Large Scale Integration).

Phase interpolation circuit 8 adjusts the phase of clock signal clk1 that is input from sampling clock extraction circuit 4 based on control signal d2 that is input from DSP 3 so as to adjust the phase of clock signal clk1 to the phase computed by DSP 3. Phase interpolation circuit 8 generates clock signal clk1 having the adjusted phase as sampling clock signal clk2.

According to this exemplary embodiment, band pass filter 6 extracts a signal having the same frequency as that of the symbol rate of coherent signal a1 from coherent signal a1 as basic clock signal clk3. Phase synchronous loop 7 locks the phase of basic clock signal clk3 extracted by band pass filter 6 and generates clock signal clk3 having the locked phase as clock signal clk1.

In this case, the phase of basic clock signal clk3 that is a signal having the same frequency as that of the symbol rate of coherent signal a1 is locked and thereby clock signal clk1 is generated.

Thus, even if the waveform distortion of coherent signal a1 is large, clock signal clk1 can be easily generated and also clock signal clk1 with less jitter can be generated.

Third Exemplary Embodiment

Figure 5:
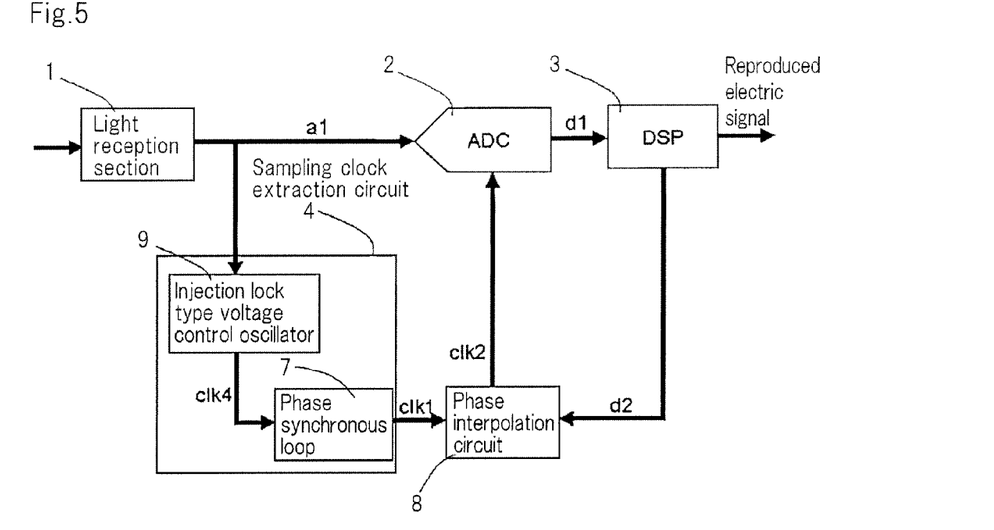
FIG. 5 is a block diagram showing a structure of a receiving device according to a third exemplary embodiment of the present invention.

FIG. 5 is a block diagram showing a structure of a receiving device according to a third exemplary embodiment of the present invention. In FIG. 5, similarly functional sections to those shown in FIG. 3 and FIG. 4 are denoted by similar reference numerals and their description will be omitted.

In FIG. 5, sampling clock extraction circuit 4 includes phase synchronous loop 7 and injection lock type voltage control oscillator 9. The structure of other sections is the same as that shown in FIG. 4. Light reception section 1 inputs coherent signal a1 to A/D converter 2 and injection lock type voltage control oscillator 9 of sampling clock extraction circuit 4.

Injection lock type voltage control oscillator 9 oscillates at a frequency in a predetermined specific frequency band. The specific frequency band is a frequency band including the frequency of clock signal clk1, namely the same frequency as that of the symbol rate of coherent signal a1.

When a signal having a frequency component in the specific frequency band is input to injection lock type voltage control oscillator 9, it locks its oscillation frequency at the input frequency component.

Thus, injection lock type voltage control oscillator 9 locks its oscillation frequency at the same frequency as that of the symbol rate of coherent signal a1 that is input from light reception section 1.

Injection lock type voltage control oscillator 9 generates the signal having the locked oscillation frequency as basic clock component signal clk4 and inputs basic clock component signal clk4 to phase synchronous loop 7.

Phase synchronous loop 7 locks the phase of basic clock component signal clk4 that is input from injection lock type voltage control oscillator 9 and generates basic clock component signal clk1 having the locked phase as clock signal clk1. As a result, the jitter of basic clock component signal clk4 is decreased and thereby appropriate clock signal clk1 is generated.

As described above, according to this exemplary embodiment, injection lock type voltage control oscillator 9 locks its oscillation frequency at the same frequency as that of the symbol rate of coherent signal a1 and generates the signal having the locked oscillation frequency as basic clock component signal clk4. Phase synchronous loop 7 locks the phase of basic clock component signal clk4 generated by injection lock type voltage control oscillator 9 and generates basic clock component signal clk4 having the locked phase as clock signal clk1.

In this case, the phase of basic clock component signal clk4 having the oscillation frequency that is the same frequency as that of the symbol rate of coherent signal a1 is locked and thereby clock signal clk1 is generated.

Thus, even if the waveform distortion of coherent signal a1 is large, clock signal clk1 with less jitter can be easily generated.

Fourth Exemplary Embodiment

Figure 6:
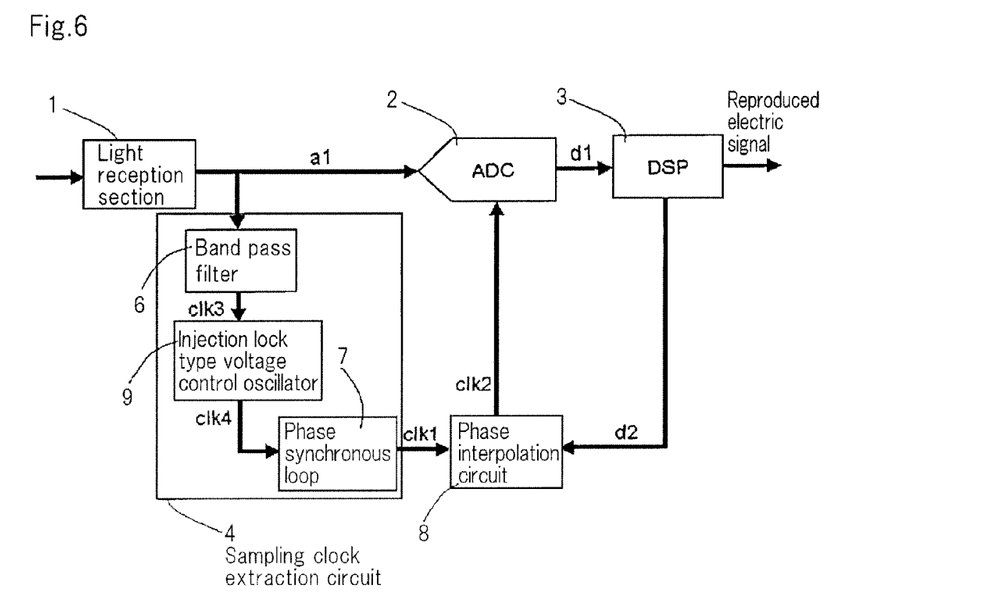
FIG. 6 is a block diagram showing a structure of a receiving device according to a fourth exemplary embodiment of the present invention.

FIG. 6 is a block diagram showing a structure of a receiving device according to a fourth exemplary embodiment of the present invention. In FIG. 6, functional sections similar to those shown in FIG. 3 to FIG. 5 are denoted by similar reference numerals and their description will be omitted.

In FIG. 6, sampling clock extraction circuit 4 includes band pass filter 6, phase synchronous loop 7, and injection lock type voltage control oscillator 9. The structure of other sections is the same as that shown in FIG. 4.

Band pass filter 6 extracts a signal having the same frequency as that of the symbol rate of coherent signal a1 as basic clock signal clk3 from coherent signal a1. Band pass filter 6 inputs basic clock signal clk3 to injection lock type voltage control oscillator 9.

Injection lock type voltage control oscillator 9 locks its oscillation frequency at the same frequency as that of the symbol rate of basic clock signal clk3 that is input from band pass filter 6 and generates a signal having the locked oscillation frequency as basic clock component signal clk4. Injection lock type voltage control oscillator 9 inputs basic clock component signal clk4 to phase synchronous loop 7.

Phase synchronous loop 7 locks the phase of basic clock component signal clk4 that is input from injection lock type voltage control oscillator 9 and thereby generates clock signal clk1. Thus, jitter of basic clock component signal clk4 is decreased and thereby appropriate clock signal clk1 is generated.

As described above, according to this exemplary embodiment, band pass filter 6 extracts a signal having the same frequency as that of the symbol rate of coherent signal a1 from coherent signal a1 as basic clock signal clk3. Injection lock type voltage control oscillator 9 locks its oscillation frequency at the same frequency as that of the symbol rate of basic clock signal clk3 and generates a signal having a locked oscillation frequency as basic clock component signal clk4. Phase synchronous loop 7 locks the phase of basic clock component signal clk4 generated by injection lock type voltage control oscillator 9 and thereby generates clock signal clk1.

In this case, basic clock signal clk3 that is a signal having the same frequency as that of the symbol rate of coherent signal a1 is extracted. In addition, the phase of basic clock component signal clk4 having the same frequency as that of basic clock signal clk3 is locked and thereby clock signal clk1 is generated.

Thus, even if the waveform distortion of coherent signal a1 is large, accurate clock signal clk1 can be easily generated.

Fifth Exemplary Embodiment

Figure 7:
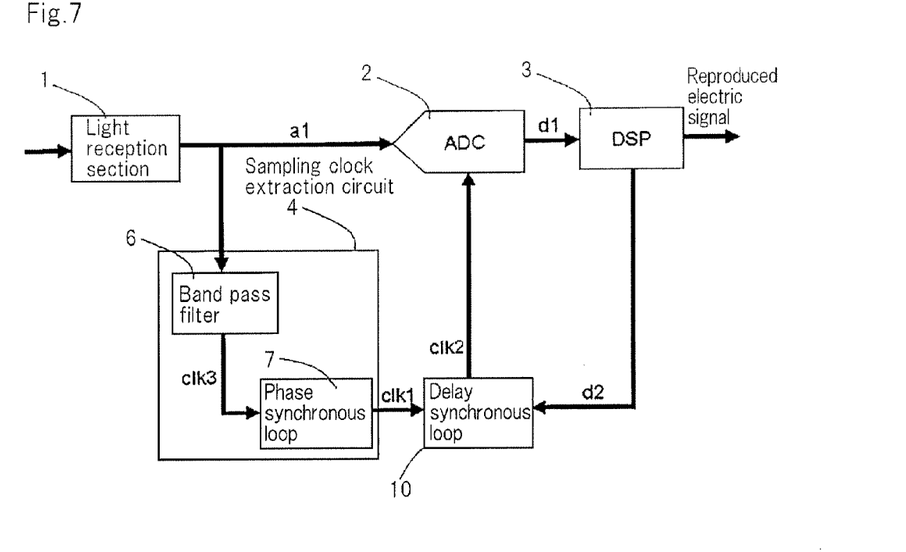
FIG. 7 is a block diagram showing a structure of a receiving device according to a fifth exemplary embodiment of the present invention.

FIG. 7 is a block diagram showing a structure of a receiving device according to a fifth exemplary embodiment of the present invention. In FIG. 7, functional sections similarly to those in FIG. 3 to FIG. 6 are denoted by similar reference numerals and their description will be omitted. In FIG. 7, delay synchronous loop 10 is used as an example of phase adjustment circuit 5. The structure of other sections is the same as that shown in FIG. 4.

Phase synchronous loop 7 inputs clock signal clk1 to delay synchronous loop 10, whereas DSP 3 inputs control signal d2 to delay synchronous loop 10.

Figure 8:
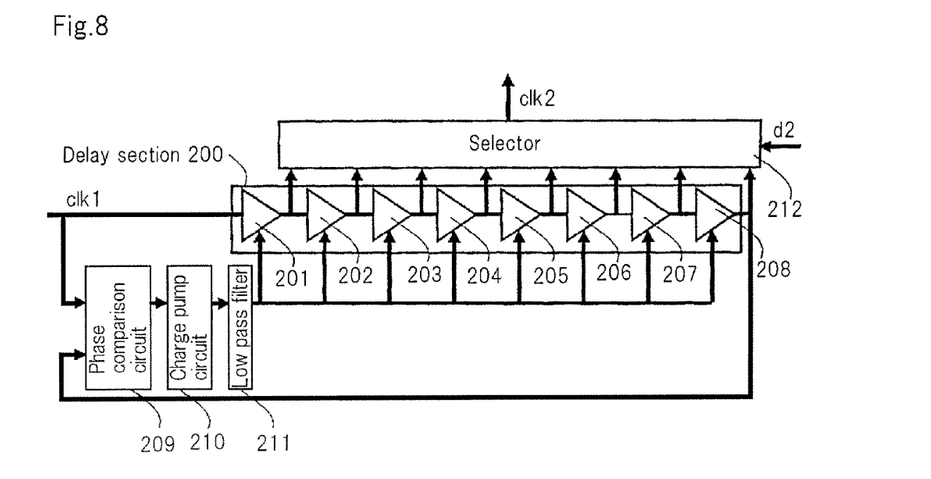
FIG. 8 is a circuit diagram exemplifying a structure of a delay synchronous loop.

FIG. 8 is a circuit diagram exemplifying a structure of delay synchronous loop 10. In FIG. 8, delay synchronous loop 10 includes delay section 200 having clock buffers 201 to 208, phase comparison circuit 209, charge pump circuit 210, low pass filter 211, and selector 212. Although the number of clock buffers shown in FIG. 8 is eight, in practice, it may be two or more instead of eight.

Clock signal clk1 that is input to delay synchronous loop 10 is input to delay section 200 and phase comparison circuit 209.

Each of clock buffers 201 to 208 included in delay section 200 is a delay circuit whose delay amount can be set up. Clock buffers 201 to 208 are connected in series. Clock signal clk1 that is input from sampling clock extraction circuit 4 is input to an input terminal of clock buffer 201 located at the front row.

Each of clock buffers 201 to 208 generates a delayed clock signal having a delay amount that has been set up. Clock buffers 201 to 207 respectively input their generated delayed clock signal to their immediately downstream buffer and selector 212. Clock buffer 208 located at the last row inputs the generated delayed clock signal to selector 212 and also inputs the delayed clock signal as a feedback signal to phase comparison circuit 209.

Thus, delay section 200 stepwise delays clock signal clk1 that is input from sampling clock extraction circuit 4 and generates a plurality of (eight in this exemplary embodiment) delayed clock signals having different phases from each other. Then, delay section 200 inputs the generated delayed clock signals to selector 212 and also inputs a delayed clock signal having the most delayed phase as a feedback signal to phase comparison circuit 209.

Phase comparison circuit 209 compares the phase of clock signal clk1 with the phase of the feedback signal and inputs the compared result to charge pump circuit 210.

In this example, phase comparison circuit 209 represents the compared result based on pulse signals containing a phase advanced pulse signal and a phase delayed pulse signal whose phases are different from each other.

If the phase of the feedback signal is later than the phase of clock signal clk1 (hereinafter sometimes referred to as the reference signal), pulse signals in which the width of the phase delayed pulse signal is longer than the width of the phase advanced pulse signal by the length corresponding to the phase difference are generated as the compared result.

In contrast, if the phase of the feedback signal is earlier than the phase of the reference signal, pulse signals in which the width of the phase advanced pulse signal is longer than the width of the phase delayed pulse signal are generated as the compared result.

Charge pump circuit 210 converts the compared result (namely, information of the phase advanced pulse signal and the phase delayed pulse signal) into a DC component as an analog signal and then inputs the resultant compared result that has been converted into the analog signal as an error signal to low pass filter 211.

Low pass filter 211 removes a high frequency component from the error signal so as to generate a delay control signal that represents delay amounts of clock buffers 202 to 208. Low pass filter 211 inputs the delay control signal to each of clock buffers 202 to 208 so as to set the delay amounts represented by the delay control signal to clock buffers 202 to 208.

As a result, when the phase of the feedback signal is synchronized with the phase of the reference signal (or their phases are shifted by an integer multiple of 360 degrees), the delayed clock signals are locked. The delay circuit generates eight differently and equally allocated clocks.

Selector 212 selects one of the delayed clock signals as sampling clock signal clk2 based on control signal d2 that is input from DSP 3 and inputs sampling clock signal clk2 that has been selected to A/D converter 2.

Then, DSP 3 obtains the difference between the phase of sampling clock signal clk2 in which the error rate of digital signal d1 is the minimum and the phase of sampling clock signal clk at present and generates a signal that causes a delayed clock signal delayed by the difference to be selected as control signal d2.

According to this exemplary embodiment, sampling clock signal clk2 can be generated using delay synchronous loop 10.

Sixth Exemplary Embodiment

Figure 9:
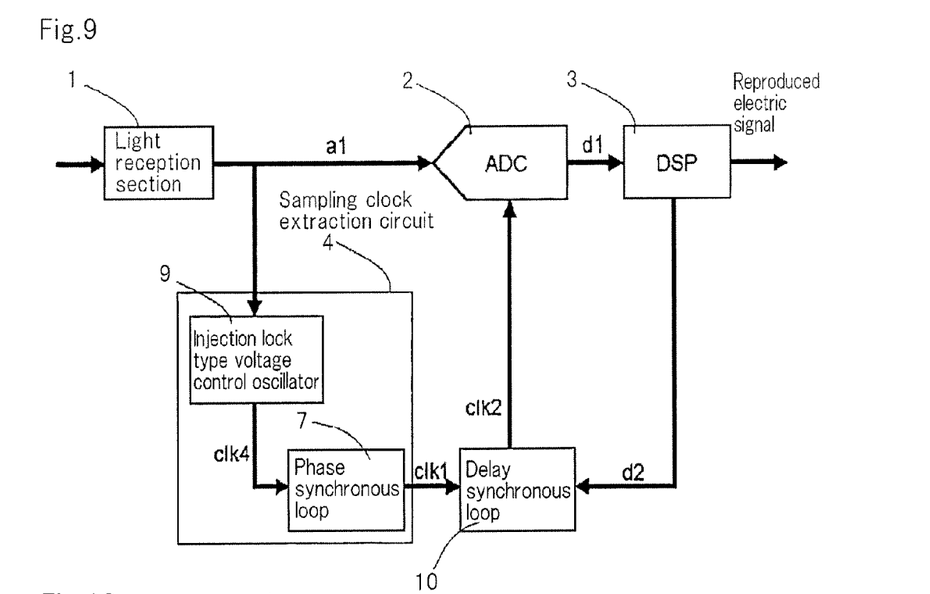
FIG. 9 is a block diagram showing a structure of a receiving device according to a sixth exemplary embodiment of the present invention.

FIG. 9 is a block diagram showing a structure of a receiving device according to a second exemplary embodiment of the present invention. In FIG. 9, functional sections similar to those shown in FIG. 3 to FIG. 7 are denoted by similar reference numerals and their description will be omitted.

In FIG. 9, like FIG. 5, sampling clock extraction circuit 4 includes phase synchronous loop 7 and injection lock type voltage control oscillator 9. Like FIG. 7, delay synchronous loop 10 is used as phase adjustment circuit 5. The structure of other sections is the same as that shown in FIG. 3.

In the structure shown in FIG. 9, even if the waveform distortion of the optical coherent signal is large, sampling can be adequately performed without necessity of a lookup table.

Seventh Exemplary Embodiment

Figure 10:
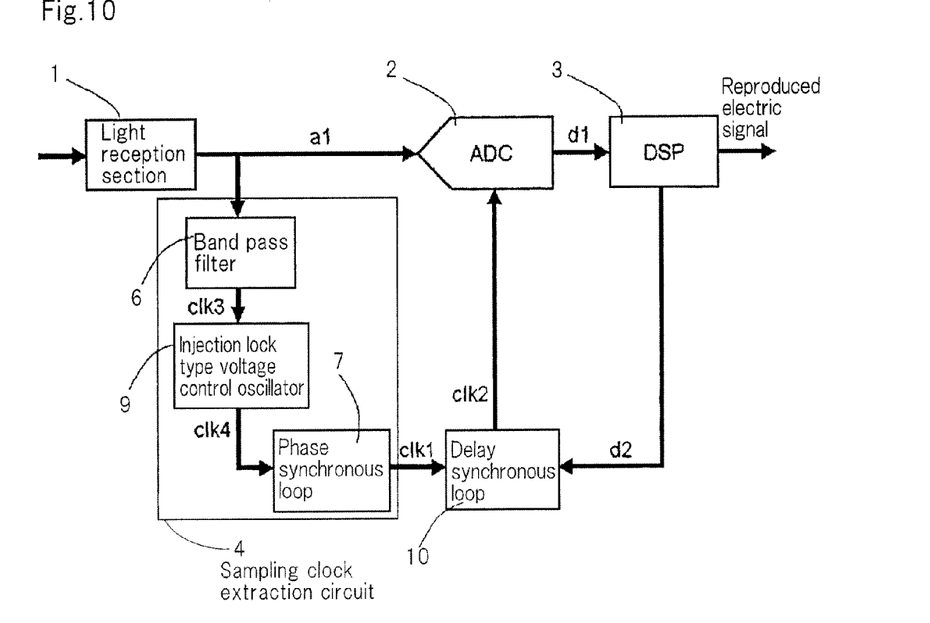
FIG. 10 is a block diagram showing a structure of a receiving device according to a seventh exemplary embodiment of the present invention.

FIG. 10 is a block diagram showing a structure of a receiving device according to the second exemplary embodiment of the present invention. In FIG. 10, functional sections similar to those shown in FIG. 3 to FIG. 9 are denoted by similar reference numerals and their description will be omitted.

In FIG. 10, like FIG. 6, sampling clock extraction circuit 4 includes band pass filter 6, phase synchronous loop 7, and injection lock type voltage control oscillator 9. Like FIG. 7, delay synchronous loop 10 is used as phase adjustment circuit 5. The structure of other sections is the same as that shown in FIG. 3.

In the structure shown in FIG. 10, even if the waveform distortion of the optical coherent signal is large, sampling can be adequately performed without necessity of a lookup table.

In each exemplary embodiment described above, the structures shown in drawings are just examples and therefore the present invention should not be limited thereto.

The present application claims a priority based on Japanese Patent Application JP 2009-114503 filed on May 11, 2009, the entire contents of which are incorporated herein by reference in its entirety.

What is claimed is:

1. A receiving device, comprising:

a reception section that receives an analog signal;

a extraction section that extracts a clock signal having a same frequency as that of a symbol rate of the analog signal from the analog signal received by said reception section;

a converter that samples the analog signal received by said reception section in synchronization with a sampling clock signal so as to convert the analog signal into a digital signal;

a controller that demodulates the digital signal converted by said converter and computes a phase of said sampling clock signal in which an error rate of the digital signal is the minimum based on the demodulated digital signal; and adjustment section that adjusts a phase of the clock signal extracted by said extraction section to the phase computed by said controller and generates the clock signal having the adjusted phase as said sampling clock signal;

wherein said extraction section includes either:

1) a band pass filter that extracts a signal having the same frequency as that of the symbol rate of the analog signal as a basic clock signal from the analog signal received by said reception section; and a phase synchronous loop that locks a phase of the basic clock signal extracted by said band pass filter so as to generate the basic clock signal having the locked phase as said clock signal; or 2) an injection lock voltage control oscillator that locks its oscillation frequency at the same frequency as that of the symbol rate of the analog signal received by said reception section and generates a signal having the locked oscillation frequency as a basic clock component signal; and a phase synchronous loop that locks a phase of the basic clock component signal generated by said injection lock voltage control oscillator and generates the basic clock component signal having the locked phase as said sampling clock signal; or 3) a band pass filter that extracts a signal having the same frequency as that of the symbol rate of the analog signal as a basic clock signal from the analog signal received by said reception section;

an injection lock voltage control oscillator that locks its oscillation frequency at the frequency of the basic clock signal extracted by said band pass filter and generates a signal having the locked oscillation frequency as a basic clock component signal; and a phase synchronous loop that locks a phase of the basic clock component signal generated by said injection lock voltage control oscillator and generates the basic clock component signal having the locked phase as said sampling clock signal.

2. A receiving device, comprising:

a reception section that receives an analog signal;

a extraction section that extracts a clock signal having a same frequency as that of a symbol rate of the analog signal from the analog signal received by said reception section;

a converter that samples the analog signal received by said reception section in synchronization with a sampling clock signal so as to convert the analog signal into a digital signal;

a controller that demodulates the digital signal converted by said converter and computes a phase of said sampling clock signal in which an error rate of the digital signal is the minimum based on the demodulated digital signal; and an adjustment section that adjusts a phase of the clock signal extracted by said extraction section to the phase computed by said controller and generates the clock signal having the adjusted phase as said sampling clock signal;

wherein said extraction section includes:

a band pass filter that extracts a signal having the same frequency as that of the symbol rate of the analog signal as a basic clock signal from the analog signal received by said reception section; and a phase synchronous loop that locks a phase of the basic clock signal extracted by said band pass filter so as to generate the basic clock signal having the locked phase as said clock signal.

3. A demodulation method comprising:

receiving an analog signal;

extracting a clock signal having a same frequency as that of a symbol rate of the analog signal from said received analog signal;

sampling said received analog signal in synchronization with a sampling clock signal so as to convert the analog signal into a digital signal;

demodulating said converted digital signal and computing a phase of said sampling clock signal in which an error rate of the digital signal is the minimum based on the demodulated digital signal; and adjusting a phase of said extracted clock signal to said computed phase and generating the clock signal having the adjusted phase as said sampling clock signal;

wherein said extracting includes either:

1) extracting a signal having the same frequency as that of the symbol rate of the analog signal as a basic clock signal from received the analog signal; and locking a phase of the basic clock signal extracted so as to generate the basic clock signal having the locked phase as said clock signal; or 2) locking an oscillation frequency at the same frequency as that of the symbol rate of the received analog signal and generating a signal having the locked oscillation frequency as a basic clock component signal; and locking a phase of the basic clock component signal generated and generating the basic clock component signal having the locked phase as said sampling clock signal; or 3) extracting a signal having the same frequency as that of the symbol rate of the analog signal as a basic clock signal from the received analog signal;

locking an oscillation frequency at the frequency of the basic clock signal extracted and generating a signal having the locked oscillation frequency as a basic clock component signal; and locking a phase of the basic clock component signal generated and generating the basic clock component signal having the locked phase as said sampling clock signal.

* * * * *